(12) United States Patent
Huang et al.

(10) Patent No.: US 11,720,138 B2
(45) Date of Patent: Aug. 8, 2023

(54) METHOD, DEVICE, AND SYSTEM FOR DELAYING SIGNALS AND MEDICAL REGISTRATION EQUIPMENT

(71) Applicant: BOE Technology Group Co., Ltd., Beijing (CN)

(72) Inventors: Jijing Huang, Beijing (CN); Dawei Tang, Beijing (CN); Zhiming Yang, Beijing (CN); Qiong Wu, Beijing (CN); Zongmin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 122 days.

(21) Appl. No.: 17/599,490

(22) PCT Filed: Oct. 29, 2020

(86) PCT No.: PCT/CN2020/124950
§ 371 (c)(1),
(2) Date: Sep. 28, 2021

(87) PCT Pub. No.: WO2022/087989
PCT Pub. Date: May 5, 2022

(65) Prior Publication Data
US 2022/0317723 A1    Oct. 6, 2022

(51) Int. Cl.
*G06F 1/10* (2006.01)
*H03K 5/135* (2006.01)
*G11C 7/22* (2006.01)
*H03L 7/07* (2006.01)

(52) U.S. Cl.
CPC .............. *G06F 1/10* (2013.01); *H03K 5/135* (2013.01); *G11C 7/222* (2013.01); *H03L 7/07* (2013.01)

(58) Field of Classification Search
None
See application file for complete search history.

(56) References Cited

U.S. PATENT DOCUMENTS

| | | | |
|---|---|---|---|
| 10,871,555 B1 * | 12/2020 | Rogers | G01S 15/931 |
| 10,873,812 B2 * | 12/2020 | Subramanian | H04R 3/12 |
| 2011/0316599 A1 | 12/2011 | Kwak | |
| 2014/0340250 A1 | 11/2014 | Dosho et al. | |

FOREIGN PATENT DOCUMENTS

| | | |
|---|---|---|
| CN | 102047340 A | 5/2011 |
| CN | 104113342 A | 10/2014 |
| CN | 105634474 A | 6/2016 |

(Continued)

*Primary Examiner* — Cassandra F Cox
(74) *Attorney, Agent, or Firm* — IPro, PLLC

(57) ABSTRACT

Provided is a method for delaying signals. The method includes: determining a total quantity of delay phases by which a drive signal is to be delayed; determining, based on a clock period of each level of delay clock signals of a plurality of levels of delay clock signals, a quantity of clock periods of each level of delay clock signals that are required for delaying by the total quantity of delay phases, wherein the clock periods of the levels of delay clock signals decrease sequentially from a first level to a last level; and delaying the drive signal by the quantities of clock periods of the levels of delay clock signals sequentially in descending order, and outputting the drive signal after delay.

17 Claims, 7 Drawing Sheets

(56) References Cited

FOREIGN PATENT DOCUMENTS

| | | | |
|---|---|---|---|
| CN | 107066096 | A | 8/2017 |
| CN | 110673731 | A | 1/2020 |
| CN | 111163559 | A | 5/2020 |
| CN | 111198835 | A | 5/2020 |
| CN | 111404536 | A | 7/2020 |
| CN | 111416601 | A | 7/2020 |
| CN | 111429826 | A | 7/2020 |
| EP | 2242178 | A1 | 10/2010 |
| WO | 2013121698 | A1 | 8/2013 |

* cited by examiner

METHOD, DEVICE, AND SYSTEM FOR DELAYING SIGNALS AND MEDICAL REGISTRATION EQUIPMENT

CROSS-REFERENCE TO RELATED APPLICATION

This application is a US national stage of PCT international patent application No. PCT/CN2020/124950 filed on Oct. 29, 2020, the disclosure of which is incorporated herein by reference in its entirety.

TECHNICAL FIELD

The present disclosure relates to the field of communications technologies, and in particular, to a method, device, and system for delaying signals and medical registration equipment.

BACKGROUND

Delaying a drive signal (signal delaying for short) is one of necessary steps to drive some equipment to work normally.

SUMMARY

The present disclosure provides a method, device, and system for delaying signals and medical registration equipment, and the technical solutions are as follows.

According to a first aspect, a method for delaying a signal is provided. The method includes:

determining a total quantity of delay phases by which a drive signal is to be delayed;

determining, based on a clock period of each level of delay clock signals of a plurality of levels of delay clock signals, a quantity of clock periods of each level of delay clock signals that are required for delaying by the total quantity of delay phases, wherein the clock periods of the levels of delay clock signals decrease sequentially from the first level to the last level; and delaying the drive signal by the quantities of clock periods of the levels of delay clock signals sequentially in descending order, and outputting the drive signal after delay.

Optionally, the plurality of levels of delay clock signals are generated based on a master clock signal; and determining, based on the clock period of each level of delay clock signals of the plurality of levels of delay clock signals, the quantity of clock periods of each level of delay clock signals that are required for delaying by the total quantity of delay phases includes:

for each level of delay clock signals, determining, based on a clock frequency of the master clock signal and a clock frequency of the delay clock signal, an alternative quantity of delay phases corresponding to the delay clock signal, wherein the alternative quantity of delay phases is a quantity of delay phases which can be completed within one clock period of the delay clock signal;

for each level of delay clock signals, determining, based on a reference quantity of delay phases and the alternative quantity of delay phases corresponding to the delay clock signal, a quantity of clock periods of the delay clock signal required for delaying by the total quantity of delay phases, wherein for the first level of delay clock signals, the reference quantity of delay phases is the total quantity of delay phases; and for each of other levels of delay clock signals except for the first level of delay clock signals, the reference quantity of delay phases is a quantity of delay phases remained after the drive signal is delayed by a quantity of clock periods of a former level of delay clock signals.

Optionally, for each level of delay clock signals, determining, based on the clock frequency of the master clock signal and the clock frequency of the delay clock signal, the alternative quantity of delay phases corresponding to the delay clock signal includes:

for each level of delay clock signals, determining a quotient acquired by dividing the clock frequency of the master clock signal by the clock frequency of the delay clock signal as the alternative quantity of delay phases corresponding to the delay clock signal.

Optionally, for each level of delay clock signals, determining, based on the reference quantity of delay phases and the alternative quantity of delay phases corresponding to the delay clock signal, the quantity of clock periods of the delay clock signal required for delaying by the total quantity of delay phases includes:

for each level of delay clock signals, rounding down a quotient acquired by dividing the reference quantity of delay phases by the alternative quantity of delay phases corresponding to the delay clock signal to acquire the quantity of clock periods of the delay clock signal required for delaying by the total quantity of delay phases.

Optionally, in the case that the drive signal undergoes transition at a first transition edge of the delay clock signal, and is delayed using a second transition edge of the first level of delay clock signals, one of the first transition edge and the second transition edge is a rising edge, and the other one is a falling edge; and for the first level of delay clock signals, determining, based on the reference quantity of delay phases and the alternative quantity of delay phases corresponding to the delay clock signal, the quantity of clock periods of the delay clock signal required for delaying by the total quantity of delay phases includes:

rounding down a quotient acquired by dividing the reference quantity of delay phases by an alternative quantity of delay phases corresponding to the first level of delay clock signals, to acquire an alternative quantity of clock periods of the first level of delay clock signals that are required for delaying by the total quantity of delay phases; and determining the sum of the alternative quantity of clock periods and ½ as a quantity of clock periods of the first level of delay clock signals that are required for delaying by the total quantity of delay phases.

Optionally, the plurality of levels of delay clock signals are of four levels, wherein a clock period of the third level of delay clock signals is eight times that of the fourth level of delay clock signals, a clock period of the second level of delay clock signals is ten times that of the third level of delay clock signals, and a clock period of the first level of delay clock signals is five times that of the second level of delay clock signals;

Optionally, determining the total quantity of delay phases by which the drive signal is to be delayed includes:

receiving delay reference information; and determining, based on the delay reference information, the total quantity of delay phases by which the drive signal is to be delayed.

Optionally, before determining the total quantity of delay phases by which the drive signal is to be delayed, the method further includes: generating the drive signal.

According to another aspect, a signal delaying circuit is provided, wherein the signal delaying circuit is configured to perform the method for delaying the signal according to the foregoing aspect.

Optionally, the signal delaying circuit is a field programmable gate array (FPGA).

According to still another aspect, a system for delaying signals is provided. The system includes: a target device, a drive circuit, and the signal delaying circuit according to the foregoing aspect; wherein the signal delaying circuit is connected to the drive circuit, and is configured to delay a drive signal by a total quantity of delay phases and output the delayed drive signal which is after delay to the drive circuit; and the drive circuit is connected to the target device, and is configured to drive, in response to the received drive signal, the target device to operate.

Optionally, the system further includes a communication module, wherein the communication module is connected to the signal delaying circuit, and is configured to receive delay reference information, and output the delay reference information to the signal delaying circuit.

Optionally, the target device is an ultrasonic transducer; and the system includes a transducer array formed by a plurality of the ultrasonic transducers; and the drive circuit is configured to drive, in response to the received drive signal, the ultrasonic transducer to emit an ultrasonic wave, thereby forming a virtual key.

According to still yet another aspect, medical registration equipment is provided. The equipment includes: a computer, a printer, a medicare card reading component, a shooting component, and a virtual key generation system that are in communicative connection with each other sequentially; wherein the virtual key generation system includes the system for delaying a signal according to the foregoing aspect;

the medicare card reading component is configured to read medicare card information, and send the medicare card information to the computer;

the shooting component is configured to: in response to detecting that a touch operation is performed on any ultrasonic transducer in the virtual key generation system, shoot an image of an area where the transducer array in the virtual key generation system is disposed, and send the image to the computer;

the computer is configured to determine, based on the image, a target ultrasonic transducer on which the touch operation is performed; in response to determining that the target ultrasonic transducer is behind a key area at a mapping location in a display interface of the computer, send delay reference information to the virtual key generation system; and generate registration information in response to a registration trigger operation, and control the printer to print the registration information; and the virtual key generation system is configured to generate a virtual key based on the delay reference information, wherein the delay reference information includes a location of the target ultrasonic transducer in the transducer array.

BRIEF DESCRIPTION OF THE DRAWINGS

In order to illustrate the technical solutions according to the embodiments of the present disclosure more clearly, a brief introduction is given hereinafter to the accompanying drawings that may be used in the description of the embodiments. Apparently, the accompanying drawings in the descriptions below are merely some embodiments of the present disclosure, and other drawings may be acquired by those of ordinary skill in the art based on these accompanying drawings without any creative efforts.

DETAILED DESCRIPTION

For clearer descriptions of the objectives, technical solutions, and advantages of the present disclosure, embodiments of the present disclosure are described in detail hereinafter by referring to the accompanying drawings.

In the related art, a to-be-delayed drive signal is generally cached by using a register; and the delayed drive signal is output at a specified moment, so as to realize delay processing of the drive signal.

However, in the case that a data volume of a to-be-delayed drive signal is larger, the number of registers required to be configured increases accordingly, which occupies more storage space of a signal delaying circuit.

Using a signal delaying circuit to delay a signal is one of necessary steps to drive some systems to operate normally. Delaying a signal may be understood as follows: after a signal (for example, a drive signal) required by a device in a system is received or generated, delaying the signal for fixed duration before outputting a delayed signal to the corresponding device. In this way, when the system includes an array formed by a plurality of same devices, signals can be output to different devices in the array via flexible delaying, such that the array can implement some specific functions, that is, the array can work reliably.

Figure 1:
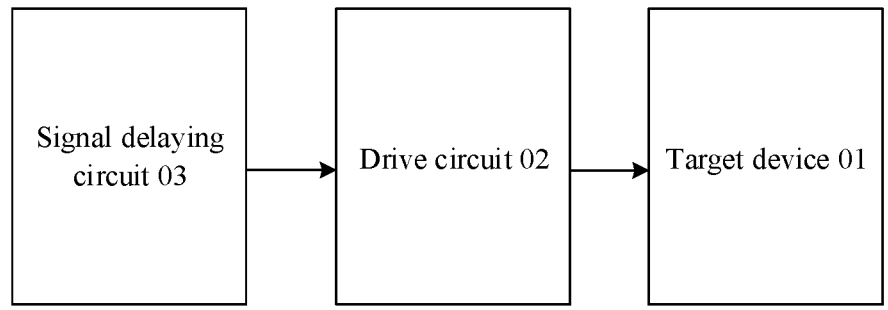
FIG. 1 is a schematic structural diagram of a system for delaying signals according to an embodiment of the present disclosure.

For example, FIG. 1 is a schematic structural diagram of a system for delaying signals. As shown in FIG. 1, the system for delaying signals includes: a target device 01, a drive circuit 02, and signal delaying circuit 03.

The signal delaying circuit 03 may be connected to the drive circuit 02, and may be configured to generate a drive signal, delay the drive signal by a total quantity of delay phases, and output the delayed drive signal to the drive circuit 02.

The drive circuit 02 may be connected to the target device 01, and may be configured to drive, based on the received drive signal, the target device 01 to work.

Optionally, the total quantity of delay phases may be used to determine signal delay duration, and may be flexibly generated by the signal delaying circuit 03 based on received delay reference information. As to different signal delay application scenarios, the delay reference information received by the signal delaying circuit 03 may be different. The delay reference information may be sent by a computer device that is in communicative connection with the system.

Figure 2:
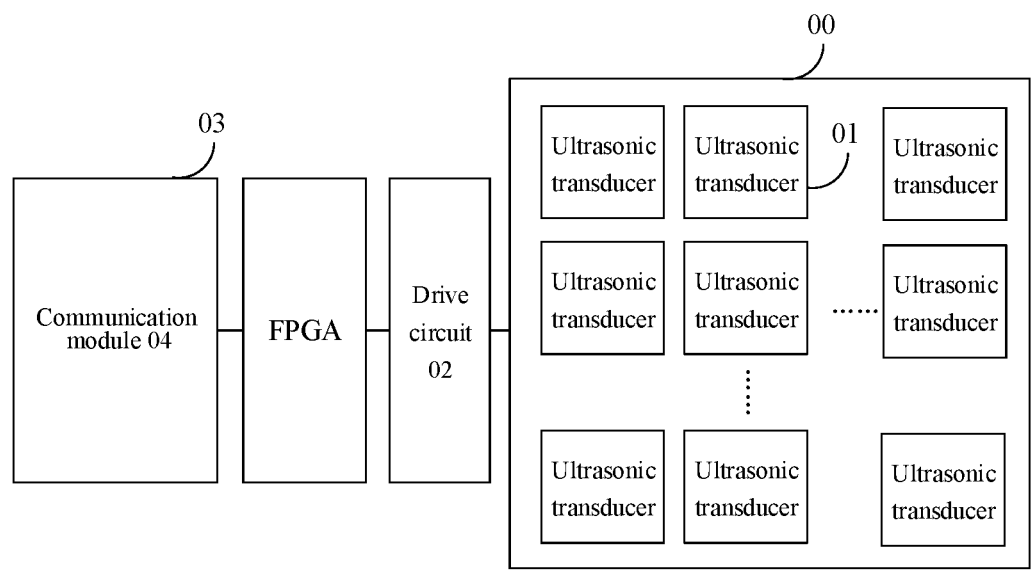
FIG. 2 is a schematic structural diagram of another system for delaying signals according to an embodiment of the present disclosure.

To illustrate the total quantity of delay phases, with reference to the system for delaying signals shown in FIG. 1, FIG. 2 shows a schematic structural diagram of another system for delaying signals. As shown in FIG. 2, the target device 01 may be an ultrasonic transducer, and the system may further include a transducer array 00 formed by a plurality of the ultrasonic transducers.

Correspondingly, the delay reference information may include locations of the target ultrasonic transducers in the transducer array 00. That the drive circuit 02 is in response to the drive signal drives the target device 01 to operate may be understood as follows: the drive circuit 02 drives the ultrasonic transducer to emit ultrasonic waves, that is, the ultrasonic transducer can emit the ultrasonic waves under the control of the received drive signal. In this way, by means of flexibly delaying drive signals output to different ultrasonic transducers, the different ultrasonic transducers in the transducer array 00 can emit ultrasonic waves at different moments, that is, different ultrasonic transducers can vibrate at different moments. Optionally, when the system shown in FIG. 2 is applied to a scenario in which a virtual key is generated, different ultrasonic transducers may be controlled to vibrate at different moments, so as to focus and form the virtual key. Forming the virtual key may alternatively be understood as forming a tactus of the virtual key, such that a user can feel a key control at a location where his/her finger is disposed.

Optionally, with reference to the system for delaying signals shown in FIG. 2, the system may further include a communication module 04. The communication module 04 may be connected to the signal delaying circuit 03. The communication module 04 may be configured to receive delay reference information, and output the delay reference information to the signal delaying circuit 03.

Figure 3:
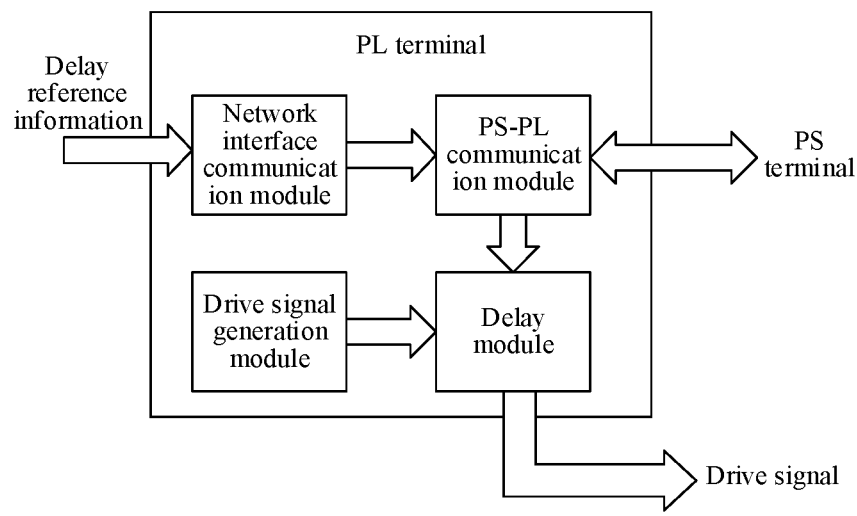
FIG. 3 is a diagram of an internal program framework of a signal delaying circuit according to an embodiment of the present disclosure.

Optionally, with reference to the system for delaying signals shown in FIG. 2, the signal delaying circuit 03 in the system may be a field programmable gate array (FPGA). For example, FIG. 3 shows a diagram of an internal program framework of the FPGA. As shown in FIG. 3, the program framework may include a PS terminal and a PL terminal. Both the PS terminal and the PL terminal may be configured to establish a direct communication connection to the communication module 04; and the PS terminal and the PL terminal may also perform data interactive transmission with each other. As an example for establishing a communication connection between the communication module 04 and the PL terminal, FIG. 3 further shows a diagram of an optional program framework included by the PL terminal. Referring to FIG. 3, the PL terminal may include a network interface communication module, a PS-PL communication module, a drive signal generation module, and a delay module.

The drive signal generation module may be configured to generate a drive signal (also referred to as excitation signal). The network interface communication module may be configured to receive delay reference information output by the communication module 04 and then send the information to the PS-PL communication module. The PS-PL communication module may further transmit the delay reference information to the PS terminal. The PS terminal may be configured to determine, based on the received delay reference information, the total quantity of delay phases required for delaying the drive signal; and transmit the total quantity of delay phases to the PL terminal via the PS-PL communication module. The delay module in the PL terminal may delay, based on the total quantity of delay phases, a drive signal generated by the drive signal generation module, and then output a delayed signal to the drive circuit 02.

It should be noted that, the signal delaying circuit 03 is not limited to a FPGA, and may alternatively be other equipment that can delay signals, for example, a single-chip microcomputer. In addition, the target device 01 is not limited to an ultrasonic transducer, and may alternatively be another device that needs to operate in response to the delayed drive signal.

Figure 4:
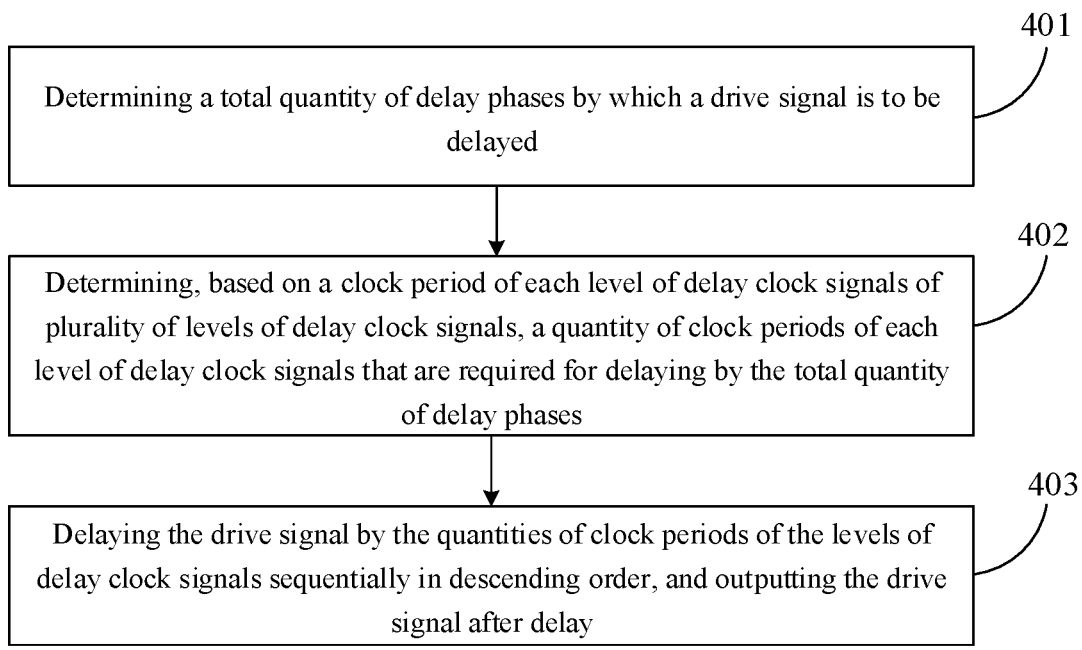
FIG. 4 is a flowchart of a method for delaying signals according to an embodiment of the present disclosure.

FIG. 4 is a schematic flowchart of a method for delaying signals according to an embodiment of the present disclosure. The method may be applied to the signal delaying circuit 03 shown in FIG. 1 or FIG. 2. As shown in FIG. 4, the method may include the following steps.

In step 401, a total quantity of delay phases by which a drive signal is to be delayed is determined.

It may be learned from the foregoing embodiments that, in this embodiment of the present disclosure, the signal delaying circuit 03 may directly determine, based on the received delay reference information, the total quantity of delay phases by which the drive signal is to be delayed. The total quantity of delay phases determines total duration required for delaying the drive signal.

In step 402, a quantity of clock periods of each level of delay clock signals of plurality of levels delay clock signals that are required for delaying by the total quantity of delay phases is determined based on a clock period of each level of delay clock signals, wherein the clock periods of each level of delay clock signals decrease sequentially from the first level to the last level, such that delay to the drive signal can be refined gradually.

Optionally, the signal delaying circuit may first determine, based on the clock period of each level of delay clock signals, a quantity of delay phases by which each level of delay clock signals can be delayed in a clock period; and then determine, based on a quantity of delay phases by which each level of delay clock signals can be delayed in each clock period, a quantity of clock periods of each level of delay clock signals that are required for delaying by the total quantity of delay phases, that is, for each level of delay clock signals, determine a quantity of clock periods of the level of delay clock signals that are required for delaying the total quantity of delay phases.

In step 403, the drive signal is delayed by the quantities of clock periods of the levels of delay clock signals sequentially in descending order, and then the drive signal which is after delay is output.

For example, assuming that the total quantity of delay phases is 2000 and there are two levels of delay clock signals, then a quantity of clock periods of the first level of delay clock signals that are required for delaying the total quantity of delay phases of the drive signal is 4, and a quantity of clock periods of the second level of delay clock signals that are required for delaying the total quantity of delay phases of the drive signal is 2. In this case, the signal delaying circuit first delays the drive signal for four clock periods of the first level of delay clock signals, and then delays the drive signal for two clock periods of the second level of delay clock signals, then outputs the drive signal, therefore, such that the drive signal can be output only after being delayed by the total quantity of delay phases.

Based on the foregoing example, it may be learned that, by means of the method for delaying signals in this embodiment of the present disclosure, when the total quantity of delay units is 2000, a total of six registers (one clock period of delay clock signals corresponds to one register) may be required. However, where a method in the related art is used for delaying, it usually requires hundreds or even thousands of registers. It may be learned from this that, in the case that drive signals to be delayed are the same, by means of the method for delaying signals in this embodiment of the present disclosure can effectively reduce a quantity of required registers, without affecting the delay effect.

In summary, this embodiment of the present disclosure provides a method for delaying signals. The method includes: determining, based on a clock period of each level of delay clock signals, a quantity of clock periods of each level of delay clock signals that are required for delaying a drive signal by a total quantity of delay phases; and sequentially delaying the drive signal based on the determined quantity of clock periods of each level of delay clock signals. Therefore, on the premise that a data volume of a to-be-delayed drive signal is fixed, compared with a method for delaying signals by directly using a register, the method according to the present disclosure not only reliably realizes signal delaying, but also effectively reduces a quantity of required registers.

Figure 5:
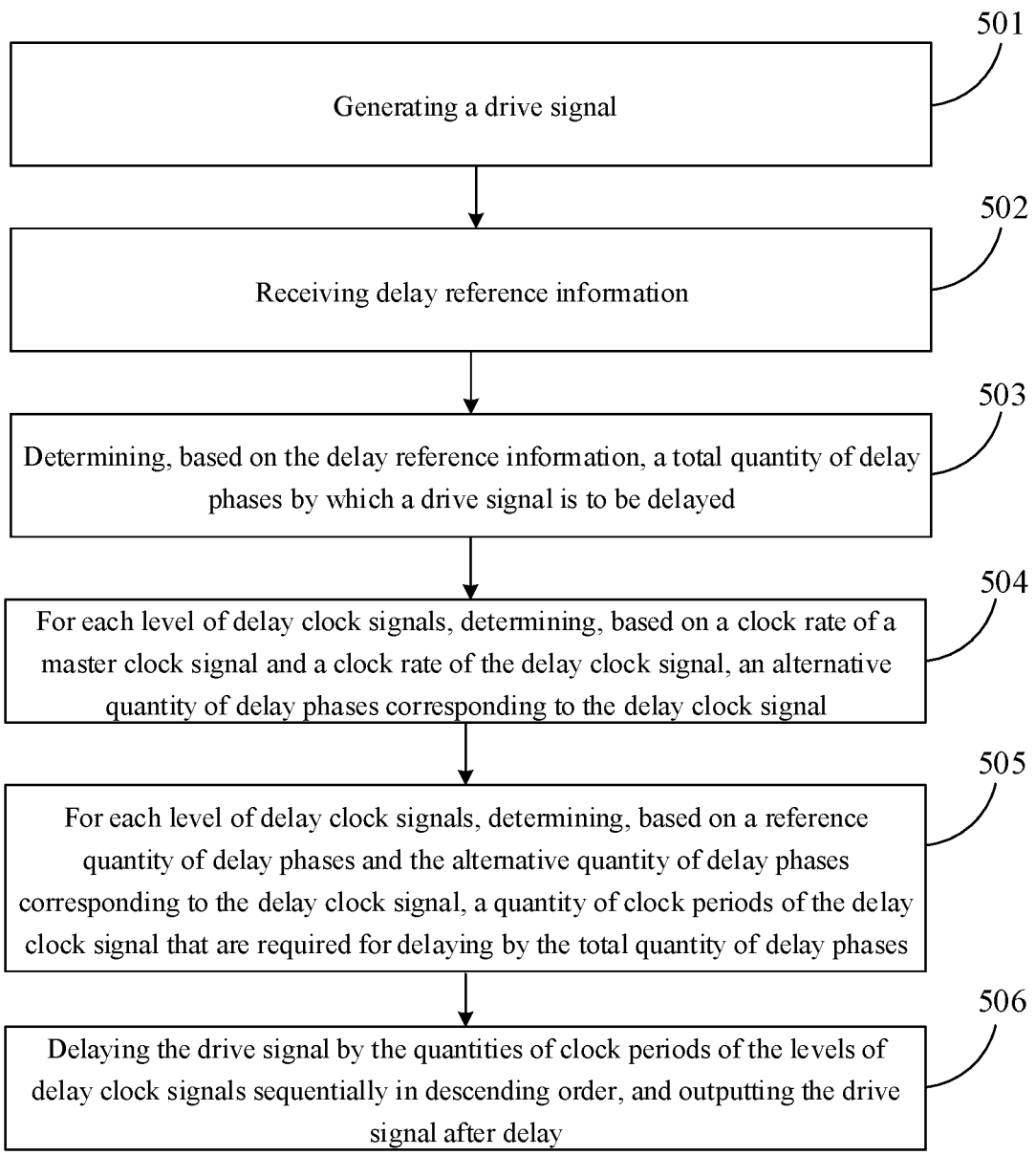
FIG. 5 is a flowchart of another method for delaying signals according to an embodiment of the present disclosure.

FIG. 5 is a schematic flowchart of another method for delaying signals according to an embodiment of the present disclosure. The method may be applied to the signal delaying circuit 03 shown in FIG. 1 or FIG. 2. As shown in FIG. 5, the method may include the following steps.

In step 501, a drive signal is generated.

Optionally, with reference to the system for delaying signals shown in FIG. 2, in this embodiment of the present disclosure, the signal delaying circuit 03 generally includes a drive signal generation module configured to generate a drive signal. The drive signal generation module may be configured to generate a drive signal required for driving the target device.

For example, with reference to FIG. 2, assuming that the target device is an ultrasonic transducer, then the generated drive signal may be signals which can drive the ultrasonic transducer to emit an ultrasonic wave. The signal may also be referred to as an excitation signal.

In step 502, delay reference information is received.

Optionally, in this embodiment of the present disclosure, the signal delaying circuit 03 may receive delay reference information sent by computer equipment which is in communication connection therewith. The delay reference information may be used by the signal delaying circuit 03 to further determine the total quantity of delay phases required for delaying the drive signal.

For example, with reference to FIG. 2, assuming that the target device is an ultrasonic transducer, then the system further includes a transducer array, the delay reference information may include a location (represented by coordinates) of a target ultrasonic transducer in the transducer array. The target ultrasonic transducer may be a transducer to be driven currently which is in the transducer array.

In step 503, a total quantity of delay phases by which a drive signal is to be delayed is determined based on the delay reference information.

Optionally, after receiving the delay reference information, the signal delaying circuit 03 may first determine, based on the received delay reference information, the duration after the current moment the target device needs to work in response to the drive signal; and then calculate, based on the determined duration, the total quantity of delay phases required for delaying the drive signal. In this way, after the drive signal is delayed by the total quantity of delay phases, the target device can receive the drive signal just at a corresponding moment (that is, after the determined duration from the current moment), and work in response to the drive signal.

For example, with reference to FIG. 2, assuming that the target ultrasonic transducer is a first ultrasonic transducer at the upper left of transducer array, the signal delaying circuit 03 may first determine, based on a location of the target ultrasonic transonic, a distance between the target ultrasonic transducer and an ultrasonic transducer in the center of the transducer array; determine, based on the location, target duration between a moment at which the target ultrasonic transducer emits an ultrasonic wave and the current moment, that is, determine the duration after the current time the target ultrasonic transducer needs to emit the ultrasonic wave; and finally determine, based on the target duration, the total quantity of delay phases required for delaying the drive signal used for driving the target ultrasonic transducer, such that the target ultrasonic transducer can emit an ultrasonic wave, in response to the delayed drive signal, after the target duration from the current moment.

In step 504, for each level of delay clock signals, an alternative quantity of delay phases corresponding to the delay clock signal is determined based on a clock frequency of a master clock signal and a clock frequency of the delay clock signal.

It should be noted that the plurality of levels of delay clock signals may be generated based on one master clock signal. In other words, the signal delaying circuit 03 may actually be connected to only one clock signal terminal which can provide the master clock signal. The clock signal terminal may be configured to generate the master clock signal. The signal delaying circuit 03 may generate, in response to the master clock signal, the plurality of levels of delay clock signals which are used for signal delaying. The quantity of levels of the generated delay clock signals may be in direct proportion to the total quantity of delay phases, that is, the larger the total quantity of delay phases, the more the quantity of levels of the generated delay clock signals, otherwise the smaller the total quantity of delay phases, the less the quantity of levels of the generated delay clock signals.

In addition, in this embodiment of the present disclosure, clock periods of each levels of delay clock signals generated by the signal delaying circuit 03 may decrease sequentially from the first level to the last level. In other words, clock frequencies of each levels of delay clock signals may increase sequentially.

Figure 6:
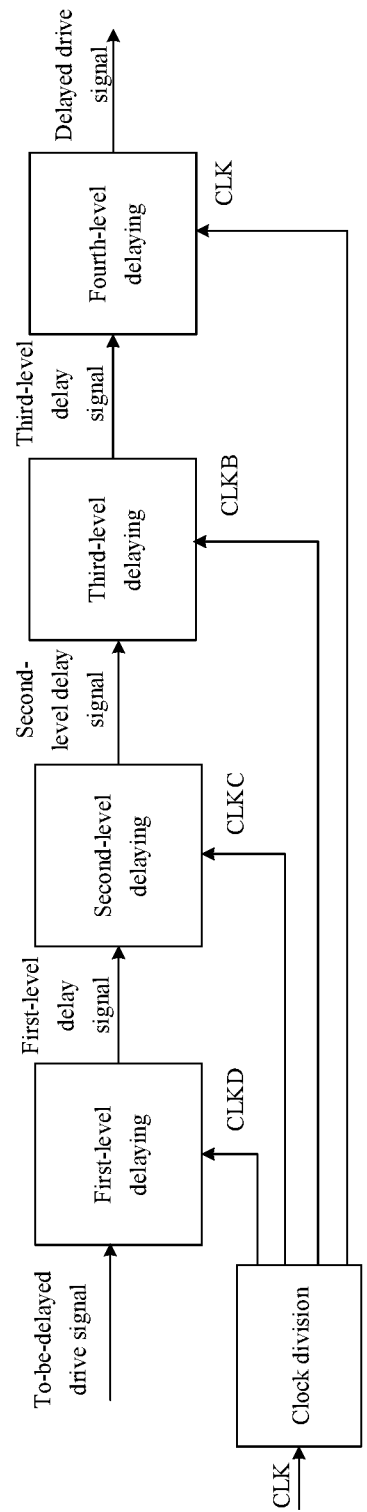
FIG. 6 is a schematic diagram of a delay sequence of a plurality of levels of delay clock signals according to an embodiment of the present disclosure.

For example, with reference to FIG. 6, the signal delaying circuit 03 may use a clock division technology to divide the master clock signal CLK into four levels of delay clock signals, wherein a clock period of the fourth level of delay clock signals CLK may be the same as that of the master clock signal CLK (such that they are marked with a same identifier); a clock period of the third level of delay clock signals CLKB may be eight times that of the fourth level of delay clock signals CLK; a clock period of the second level of delay clock signals CLKC may be ten times that of the third level of delay clock signals CLKB; and a clock period of the first level of delay clock signals CLKD may be five times that of the second level of delay clock signals CLKC.

In other words, a clock frequency of the first level of delay clock signals CLKD may be five frequency divisions (namely, ⅕) that of the second level of delay clock signals CLKC; the clock frequency of the second level of delay clock signals CLKC may be ten frequency divisions that of the third level of delay clock signals CLKB; the clock frequency of the third level of delay clock signals CLKB may be eight frequency divisions that of the fourth level of delay clock signals CLK; and the clock frequency of the fourth level of delay clock signals CLK may be the same as the master clock signal CLK.

Figure 7:
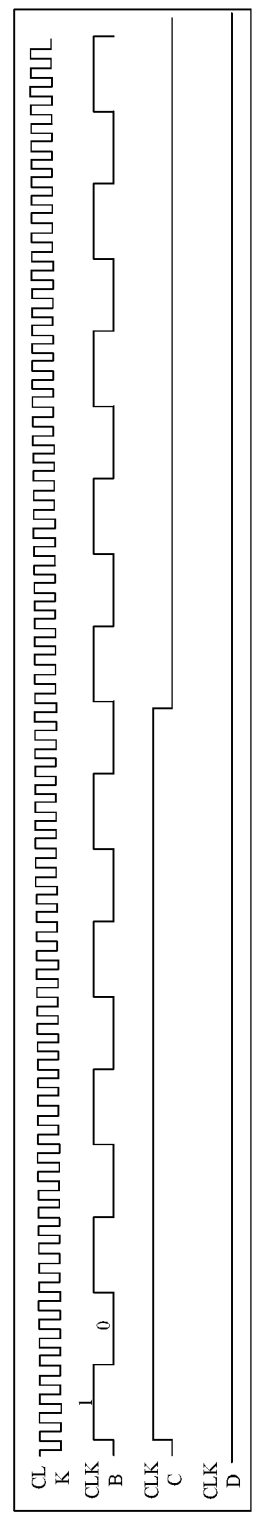
FIG. 7 is a simulation diagram of each level of delay clock signals according to an embodiment of the present disclosure.
Figure 8:
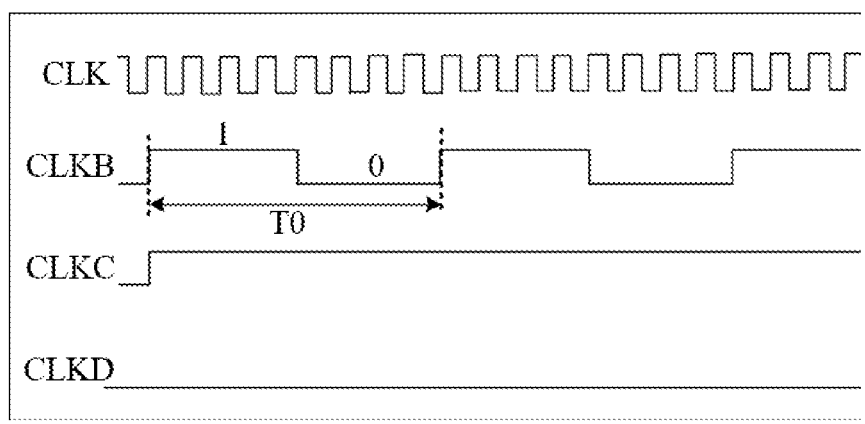
FIG. 8 is a partially enlarged diagram of the simulation diagram shown in FIG. 7.

Optionally, FIG. 7 illustratively shows a simulation diagram of the fourth level of delay clock signals; and FIG. 8 is a partially enlarged diagram of the simulation diagram shown in FIG. 7.

It should be noted that, this embodiment of the present disclosure does not limit the quantity of levels of the generated delay clock signals and the frequency of each level of delay clock signals to the content recorded in the foregoing embodiment, that is, there may be more or fewer levels of delay clock signals, and the frequency and period of each level of delay clock signals may alternatively meet other conditions. Details are not described herein.

Optionally, the alternative quantity of delay phases may be a quantity of delay phases which can be completed within one clock period of the delay clock signal, that is, for each level of delay clock signals, a quantity of delay phases by which the delay clock can be delayed when one clock period of the delay clock signal is used to delay the drive signal. A clock period may be a stage from one rising edge to an adjacent rising edge, or a stage from one falling edge to an adjacent falling edge. For example, with reference to the foregoing simulation diagram shown in FIG. 8, TO represents a clock period of the third level of delay clock signals CLKB, and the same is true for other delay clock signals.

Optionally, in this embodiment of the present disclosure, for each level of delay clock signals, the signal delaying circuit 03 may determine a quotient acquired by dividing the clock frequency of the master clock signal by the clock frequency of the delay clock signal as the alternative quantity of delay phases corresponding to the delay clock signal. In addition, because the clock periods are in inverse proportion to the clock frequencies, the clock periods may also be used to calculate the alternative quantity of delay phases. Further details are not described herein.

For example, assuming that the clock frequency of the master clock signal CLK is 32 MHz and the clock frequency of the first level of delay clock signals CLKD is 80 KHz, then it may be learned, according to the method for determining the alternative quantity of delay phases, that the alternative quantity of delay phases Num_subD (also referred to as delay data) for the first level of delay clock signals CLKD may be 32 MHz/80 KHz=400, that is, the first level of delay clock signals CLKD can delay the drive signal for 400 units within one clock period.

In step 505, for each level of delay clock signals, a quantity of clock periods of the delay clock signal that are required for delaying by the total quantity of delay phases is determined based on a reference quantity of delay phases and the alternative quantity of delay phases corresponding to the delay clock signal, where for the first level of delay clock signals, the reference quantity of delay phases may be the total quantity of delay phases; and for other levels of delay clock signals except for the first level of delay clock signals, the reference quantity of delay phases may be a quantity of delay phases remained after the drive signal is delayed by a quantity of clock periods of a former level of delay clock signals.

For example, assuming that the total quantity of delay phases is 2025, then for the first level of delay clock signals CLKD, the reference quantity of delay phases is 2025. Further, assuming that the first level of delay clock signals CLKD delay the drive signal for 1025 units in total, then a remained quantity of delay phases is: 2025−1025=1000. Accordingly, for the second level of delay clock signals CLKC, the reference quantity of delay phases is 1000. By analogy, details are not described.

In order to effectively delay the drive signal, for each level of delay clock signals, the signal delaying circuit 03 may round down a quotient acquired by dividing the reference quantity of delay phases by the alternative quantity of delay phases corresponding to the delay clock signal to acquire the quantity of clock periods of the delay clock signal that are required for delaying by the total quantity of delay phases. Rounding down may refer to ignore the rules for rounding, and ignore decimals as long as there are decimals behind a decimal point.

For example, assuming that the total quantity of delay phases is 2025, the alternative quantity of delay phases corresponding to the first level of delay clock signals CLKD is 400, that is, the first level of delay clock signals CLKD may perform delaying by 400 units within one clock period. Accordingly, it may be calculated that a quantity of clock periods NumD of the level (refer to the first level herein) of delay clock signals CLKD that are required for delaying by the total quantity of delay phases is: 2025/400=4.56, and its rounding down result is 4, that is, in order to delay the drive signal by 2025 units, four clock periods of the first level of delay clock signals CLKD are required.

It should be noted that, for addressment of the issue that the drive signal competes with the first level of delay clock signals for a same edge, the following settings may be used: the drive signal undergoes transition at a first transition edge of the first level of delay clock signals CLKD; and a second transition edge of the first level of delay clock signals CLKD is used to delay the drive signal, wherein one of the first transition edge and the second transition edge is a rising edge, and the other one is a falling edge, that is, assuming that the drive signal undergoes transition at the rising edge, then the falling edge of the first level of delay clock signals CLKD is used to delay the drive signal.

In this way, for the first level of delay clock signals CLKD, the drive signal is first delayed by ½ clock period of CLKD, and then delayed by each complete clock period of CLKD. In addition, for delaying the drive signal for ½ clock period of CLKD, a quantity of delay phases by which delaying can be performed is ½ an alternative quantity of delay phases of CLKD within one clock period. Accordingly, for the first level of delay clock signals CLKD, first, an alternative quantity of clock periods of the first level of delay clock signals that are required for delaying by the total quantity of delay phases may be acquired by rounding down a quotient acquired by dividing the total quantity of delay phases by the alternative quantity of delay phases; and then, the sum of the alternative quantity of clock periods and ½ may be determined as a final quantity of clock periods of the delay clock signal CLKD that are required for delaying the drive signal for the total quantity of delay phases.

For example, assuming that the delay phases are 2025, then the alternative quantity of clock periods of the first level of delay clock signals CLKD that are required is 4, and further, the final quantity of clock periods of the delay clock signal CLKD that are required for delaying by the 2025 unit is actually 4.5. Assuming that an alternative quantity of delay phases of the first level of delay clock signals CLKD is 400, then a quantity of delay phases by which delaying can be performed within ½ clock period of CLKD is 200. After delaying by the first level of delay clock signals CLKD, a remained quantity of delay phases is: 2025−400*4−200=225, that is, 225 units remain, and another level of delay clock signals behind the first level of delay clock signals CLKD is required to be used for further delaying. In this case, for the second level of delay clock signals CLKC, a reference quantity of delay phases NumC is 225. In the case that a drive signal data_D is changed to data_C after being delayed by the first level of delay clock signals CLKD, thus differences between data_C and data_D are 400*4+200=1800 units and 4.5 clock periods of CLKD.

In step 506, the drive signal is delayed by the quantities of clock periods of the levels of delay clock signals sequentially in descending order, and then the delayed drive signal is output.

In this embodiment of the present disclosure, in response to determining a quantity of clock periods of each level of delay clock signals that are required for delaying by the total quantity of delay phases, the signal delaying circuit 03 may use the quantity of clock periods of each level of delay clock signals to delay the drive signal and output the delayed drive signal.

For example, assuming that there are four levels of delay clock signals shown in FIG. 6 in total, a quantity of clock periods of the first level of delay clock signals CLKD is 4.5, a quantity of clock periods of the second level of delay clock signals CLKC is 2, a quantity of clock periods of the third level of delay clock signals CLKB is 1, and a quantity of clock periods of the fourth level of delay clock signals CLK is 0.5, then the signal delaying circuit 03 may use 4.5 clock periods of CLKD to perform a first-level delaying on a to-be-delayed drive signal (data_D), and acquire a first-level delay signal (data_C) upon the delaying; use 2 clock periods of CLKC to perform a second-level delaying on the first-level delay signal, and acquire a second-level delay signal (data_B) upon the delaying; then use 1 clock period of CLKB to perform third-level delaying on the second-level delay signal, and acquiring a third-level delay signal (data); and finally, use 0.5 clock periods of CLK to perform fourth-level delaying on the third-level delay signal, acquire a finally delayed drive signal, and output the finally delayed drive signal to the drive circuit 02.

Figure 9:
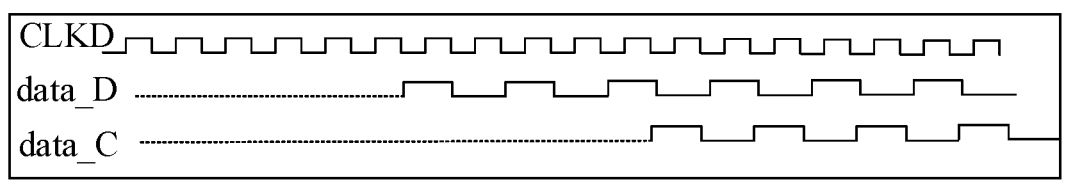
FIG. 9 is a timing simulation diagram of drive signals before and after delaying according to an embodiment of the present disclosure.

For example, FIG. 9 shows a timing simulation diagram of a drive signal data_D before delaying and a drive signal data_C after the delaying. With reference to FIG. 9, it may be further learned that, a difference between the drive signal data_C after the delaying and the drive signal data_D before the delaying is 4.5 clock periods TO of the delay clock signal CLKD.

Optionally, for the fourth-level delaying, the last delaying may alternatively be performed by directly using a register to cache delaying. With reference to FIG. 3 and FIG. 6, the first-level delaying may be delaying performed by a program module D (Module D) in the signal delaying circuit 03, the second-level delaying may be delaying performed by a program module C (Module C) in the signal delaying circuit 03, the third-level delaying may be delaying performed by a program module B (Module B) in the signal delaying circuit 03, the fourth-level delaying may be delaying performed by a program module A (Module A) in the signal delaying circuit 03. The four modules A to D are all virtual program modules.

It should be noted that, with reference to FIG. 6, the drive signal may be first cashed in the first-level delaying, so as to be aligned with a transition edge of the plurality of levels of delay clock signals (including the first level of delay clock signals CLKD, the second level of delay clock signals CLKC, and the third level of delay clock signals CLKB), which can avoid an error which is caused in a subsequent delay process due to misalignment of transition edges.

It should be also noted that, the order of the steps of the method for delaying signals according to this embodiment of the present disclosure can be appropriately adjusted. The steps may also be removed or added as required. For example, the order of step 501 and step 502 can be exchanged. Any variation method readily figured out by a person skilled in the art within the technical scope disclosed in the embodiments of the present disclosure shall fall within the protection scope of the present disclosure. Therefore, details are not described herein again.

In summary, this embodiment of the present disclosure provides a method for delaying signals. The method includes: determining, based on a clock period of each level of delay clock signals, a quantity of clock periods of each level of delay clock signals that are required for delaying a drive signal by a total quantity of delay phases; and sequentially delaying the drive signal based on the determined quantity of clock periods of each level of delay clock signals. Therefore, on the premise that a data volume of a to-be-delayed drive signal is fixed, compared with a method for delaying signals by directly using a register, the method according to the present disclosure not only reliably realizes signal delaying, but also effectively reduces a quantity of required registers.

Figure 10:
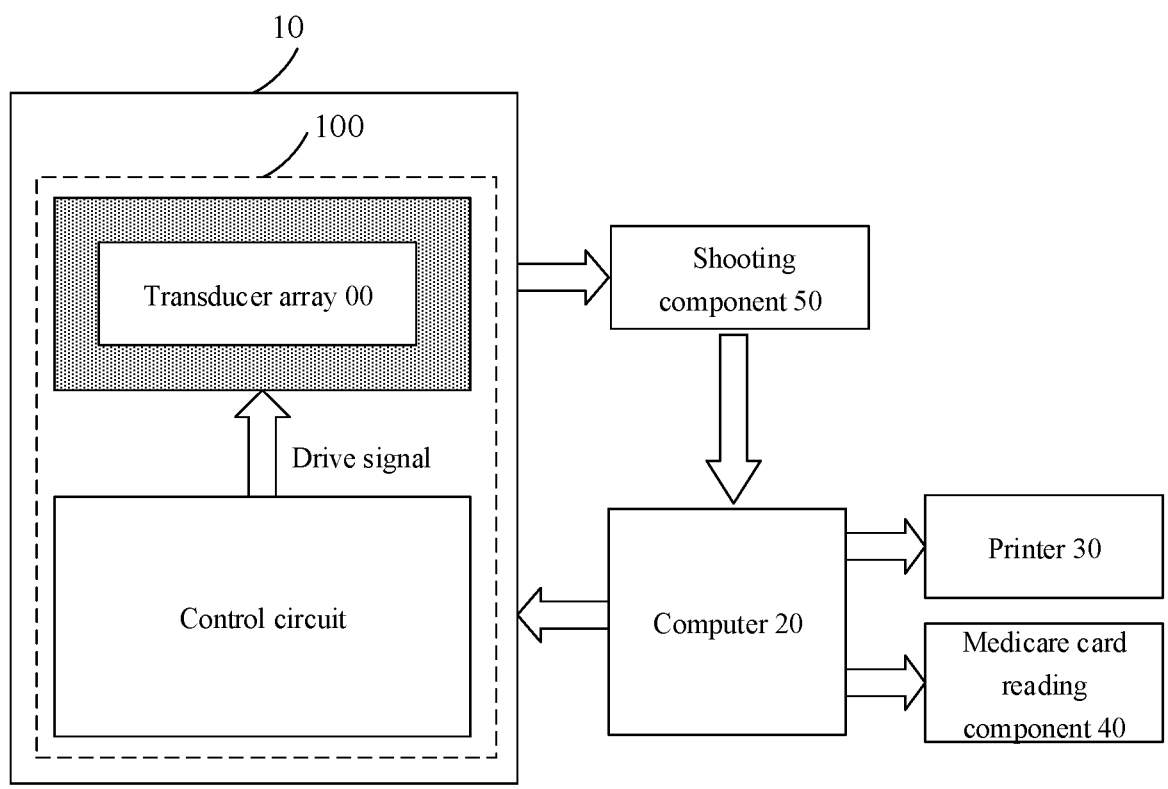
FIG. 10 is a schematic structural diagram of medical registration equipment according to an embodiment of the present disclosure.

Optionally, an embodiment of the present disclosure further provides medical registration equipment. As shown in FIG. 10, the medical registration equipment may include: a virtual key generation system 10, a computer 20, a printer 30, a medicare card reading component 40, and a shooting component 50 that are in communicative connection with each other sequentially, wherein the virtual key generation system 10 may include the system for delaying signals 100 shown in any one of FIG. 1 to FIG. 3. In addition, with reference to FIG. 10, the system for delaying signals 100 may include a transducer array 00, and a control circuit for controlling the transducer array 00 to work. With the foregoing embodiments, it can be learned that, the control circuit may include a communication module 04, the signal delaying circuit 03, and the drive circuit 02 (not shown in FIG. 10).

Optionally, the medicare card reading component 40 may be configured to read the information of medicare card, and send the information of medicare card to the computer 20. The information of medicare card may be information of a medicare card disposed on the medicare card reading component 40 by a user to be registered, that is, during registration, the user may directly put the medicare card on the medicare card reading component 40, such that the medicare card reading component 40 can read the information within the medicare card (medicare card information for short).

The shooting component 50 may be configured to: in response to detecting that a touch operation is performed on any ultrasonic transducer in the virtual key generation system 10, then shoot an image of an area where the transducer array 00 in the virtual key generation system 10 is disposed, and send the image to the computer 20.

For example, the user may perform the touch operation on the virtual key generation system 10, and the touch operation may be mapped to a display interface of the computer 20, that is, all of a series of operations performed by the user on the virtual key generation system 10 may be mapped to operations performed on the computer 20. In this way, the user does not directly touch the computer 20 to perform any operation. Therefore, the medical registration equipment may also be referred to as non-contact registration equipment. When the user touches the virtual key generation system 10, the shooting component 50 may shoot an image in a real-time fashion, so as to capture the image of the area where the transducer array 00 in the virtual key generation system 10 is disposed, and send the image to the computer 20. Optionally, the shooting component 50 may be a depth camera.

The computer 20 may be configured to: determine, based on the received image, the target ultrasonic transducer on which the touch operation is performed; and in response to determining that a mapping location of the target ultrasonic transducer in the display interface of the computer 20 is behind a key area, send delay reference information to the virtual key generation system 10. In addition, the computer 20 may be configured to: generate registration information in response to the registration trigger operation, and control the printer 40 to print the registration information. The virtual key generation system 10 may be configured to form a virtual key based on the received delay reference information.

Optionally, the key area is an area where a key control is disposed in the display interface of the computer 20. In this embodiment of the present disclosure, the computer 20 may flexibly determine, based on the image shot by the shooting component 50, a location where the touch operation of the user acts on the virtual key generation system 10, that is, determine a location of a target ultrasonic transducer on which the user performs the touch operation. In addition, after it is determined that the target ultrasonic transducer is behind the key area, the computer 20 may further send the delay reference information to the virtual key generation system 10, such that the virtual key generation system 10 drives, based on the delay reference information, the ultrasonic transducer to emit an ultrasonic wave at a specified moment. Therefore, the transducer array focuses to form the virtual key, wherein the virtual key is a key control in the key area displayed corresponding to the display interface of the computer 20. The virtual key may include ultrasonic transducers which vibrate at different moments. The user can determine, by sensing the vibration, whether the touch operation is in the key area currently Optionally, in this embodiment of the present disclosure, the delay reference information may include a location of the target ultrasonic transducer in the transducer array. In addition, the delay reference information may further include information which can be used to calculate the total quantity of delay phases, for example, a central location of the key area, and a current location of the touch operation in the display interface.

When the user further performs a click operation on the virtual key, the computer 20 can receive the registration trigger operation. In this case, the computer may perform subsequent operations, for example, generate registration information and drive the printer 40 to print the registration information, thereby finishing the entire registration processing.

It should be noted that, there may be one or more ultrasonic transducers for which the touch operation is performed. In the case that a plurality of ultrasonic transducers are configured, the target ultrasonic transducer may be the one having the largest area overlapped with the touch operation. In addition, the system for delaying signals recorded in the embodiments of the present disclosure and the method for delaying signals combined therewith are not limited to being applied to the medical registration scenario shown in FIG. 10. For example, they may also be applied to other scenarios such as radar imaging.

Described above are merely optional embodiments of the present disclosure, but not to limit the present disclosure. Any modification, equivalent replacement, or improvement made without departing from the spirit and principle of the present disclosure shall fall within the protection scope of the present disclosure.

What is claimed is:

1. A method for delaying signals, wherein the method comprises:
    determining a total quantity of delay phases by which a drive signal is to be delayed;
    determining, based on a clock period of each level of delay clock signals of a plurality of levels of delay clock signals, a quantity of clock periods of each level of delay clock signals that are required for delaying by the total quantity of delay phases, wherein the clock periods of the levels of delay clock signals decrease sequentially from a first level to a last level; and
    delaying the drive signal by the quantities of clock periods of the levels of delay clock signals sequentially in descending order, and outputting the drive signal after delay.

2. The method according to claim 1, wherein the plurality of levels of delay clock signals are generated based on a master clock signal; and determining, based on the clock period of each level of delay clock signals of the plurality of levels of delay clock signals, the quantity of clock periods of each level of delay clock signals that are required for delaying by the total quantity of delay phases comprises:
    for each level of delay clock signals, determining, based on a clock frequency of the master clock signal and a clock frequency of the delay clock signal, an alternative quantity of delay phases corresponding to the delay clock signal, wherein the alternative quantity of delay phases is a quantity of delay phases which are completed within one clock period of the delay clock signal;
    for each level of delay clock signals, determining, based on a reference quantity of delay phases and the alternative quantity of delay phases corresponding to the delay clock signal, a quantity of clock periods of the delay clock signal that are required for delaying by the total quantity of delay phases, wherein
    for the first level of delay clock signals, the reference quantity of delay phases is the total quantity of delay phases; and for each of other levels of delay clock signals except for the first level of delay clock signals, the reference quantity of delay phases is a quantity of delay phases remained after the drive signal is delayed by a quantity of clock periods of a former level of delay clock signals.

3. The method according to claim 2, wherein for each level of delay clock signals, said determining the alternative quantity of delay phases corresponding to the delay clock signal comprises:
    for each level of delay clock signals, determining a quotient acquired by dividing the clock frequency of the master clock signal by the clock frequency of the delay clock signal as the alternative quantity of delay phases corresponding to the delay clock signal.

4. The method according to claim 2, wherein for each level of delay clock signals, said determining the quantity of clock periods of the delay clock signal that are required for delaying by the total quantity of delay phases comprises:
for each level of delay clock signals, rounding down a quotient acquired by dividing the reference quantity of delay phases by the alternative quantity of delay phases corresponding to the delay clock signal to acquire the quantity of clock periods of the delay clock signal that are required for delaying by the total quantity of delay phases.

5. The method according to claim 4, wherein for each level of delay clock signals, said determining the alternative quantity of delay phases corresponding to the delay clock signal comprises: for each level of delay clock signals, determining a quotient acquired by dividing the clock frequency of the master clock signal by the clock frequency of the delay clock signal as the alternative quantity of delay phases corresponding to the delay clock signal, wherein
the plurality of levels of delay clock signals are of four levels, wherein a clock period of the third level of delay clock signals is eight times that of the fourth level of delay clock signals, a clock period of the second level of delay clock signals is ten times that of the third level of delay clock signals, and a clock period of the first level of delay clock signals is five times that of the second level of delay clock signals;
determining the total quantity of delay phases by which the drive signal is to be delayed comprises: receiving delay reference information; and determining, based on the delay reference information, the total quantity of delay phases by which the drive signal is to be delayed; and
before determining the total quantity of delay phases by which the drive signal is to be delayed, the method further comprises: generating the drive signal.

6. The method according to claim 2, wherein in the case that the drive signal undergoes transition at a first transition edge of the delay clock signal, and is delayed using a second transition edge of the first level of delay clock signals, one of the first transition edge and the second transition edge is a rising edge, and the other one is a falling edge; and for the first level of delay clock signals, said determining the quantity of clock periods of the delay clock signal that are required for delaying by the total quantity of delay phases comprises:
rounding down a quotient acquired by dividing the reference quantity of delay phases by an alternative quantity of delay phases corresponding to the first level of delay clock signals, to acquire an alternative quantity of clock periods of the first level of delay clock signals that are required for delaying by the total quantity of delay phases; and
determining the sum of the alternative quantity of clock periods and ½ as a quantity of clock periods of the first level of delay clock signals that are required for delaying by the total quantity of delay phases.

7. The method according to claim 1, wherein the plurality of levels of delay clock signals are of four levels, wherein a clock period of the third level of delay clock signals is eight times that of the fourth level of delay clock signals, a clock period of the second level of delay clock signals is ten times that of the third level of delay clock signals, and a clock period of the first level of delay clock signals is five times that of the second level of delay clock signals.

8. The method according to claim 1, wherein determining the total quantity of delay phases by which the drive signal is to be delayed comprises:
receiving delay reference information; and
determining, based on the delay reference information, the total quantity of delay phases by which the drive signal is to be delayed.

9. The method according to claim 1, wherein before determining the total quantity of delay phases by which the drive signal is to be delayed, the method further comprises: generating the drive signal.

10. A signal delaying circuit, configured to perform the method for delaying signals as defined in claim 1.

11. The signal delaying circuit according to claim 10, wherein the signal delaying circuit is a field programmable gate array (FPGA).

12. A system for delaying signals, wherein the system comprises: a target device, a drive circuit, and the signal delaying circuit as defined in claim 11; wherein
the signal delaying circuit is connected to the drive circuit, and is configured to delay a drive signal by a total quantity of delay phases and output the delayed drive signal to the drive circuit; and
the drive circuit is connected to the target device, and is configured to drive, in response to the received drive signal, the target device to operate.

13. A system for delaying signals, wherein the system comprises: a target device, a drive circuit, and the signal delaying circuit as defined in claim 10; wherein
the signal delaying circuit is connected to the drive circuit, and is configured to delay a drive signal by a total quantity of delay phases and output the delayed drive signal to the drive circuit; and
the drive circuit is connected to the target device, and is configured to drive, in response to the received drive signal, the target device to operate.

14. The system according to claim 13, further comprising a communication module; wherein the communication module is connected to the signal delaying circuit, and is configured to receive delay reference information, and output the delay reference information to the signal delaying circuit.

15. The system according to claim 14, wherein the target device is an ultrasonic transducer; and the system further comprises a transducer array formed by a plurality of the ultrasonic transducers; wherein
the drive circuit is configured to drive, in response to the received drive signal, the ultrasonic transducer to emit an ultrasonic wave to form a virtual key.

16. The system according to claim 13, wherein the target device is an ultrasonic transducer; and the system further comprises a transducer array formed by a plurality of the ultrasonic transducers; wherein
the drive circuit is configured to drive, in response to the received drive signal, the ultrasonic transducer to emit an ultrasonic wave to form a virtual key.

17. Medical registration equipment, comprising: a computer, a printer, a medicare card reading component, a shooting component, and a virtual key generation system that are in communicative connection with each other sequentially; wherein
the virtual key generation system comprises the system for delaying signals as defined in claim 16;
the medicare card reading component is configured to read medicare card information, and send the medicare card information to the computer;

the shooting component is configured to: in response to detecting that a touch operation is performed on any ultrasonic transducer in the virtual key generation system, shoot an image of an area where the transducer array in the virtual key generation system is disposed, and send the image to the computer;

the computer is configured to determine, based on the image, a target ultrasonic transducer on which the touch operation is performed; in response to determining that the target ultrasonic transducer is behind a key area at a mapping location in a display interface of the computer, send delay reference information to the virtual key generation system; and generate registration information in response to a registration trigger operation, and control the printer to print the registration information; and the virtual key generation system is configured to generate a virtual key based on the delay reference information, wherein the delay reference information comprises a location of the target ultrasonic transducer in the transducer array.

* * * * *